United States Patent
Montoya et al.

(10) Patent No.: US 11,639,973 B2
(45) Date of Patent: May 2, 2023

(54) SUPERCONDUCTING ELECTRONIC CIRCUIT

(71) Applicant: Naval Information Warfare Center Pacific, San Diego, CA (US)

(72) Inventors: Sergio A Montoya, Chula Vista, CA (US); Benjamin J Taylor, Escondido, CA (US); Susan Anne Elizabeth Berggren, San Diego, CA (US); Anna Leese de Escobar, Encinitas, CA (US); Nicholas Ferrante, Lakeside, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 182 days.

(21) Appl. No.: 17/375,118

(22) Filed: Jul. 14, 2021

(65) Prior Publication Data
US 2023/0016120 A1    Jan. 19, 2023

(51) Int. Cl.
*G01R 33/54*     (2006.01)
*G01R 33/035*    (2006.01)
*H01F 6/00*      (2006.01)

(52) U.S. Cl.
CPC ........... *G01R 33/0354* (2013.01); *H01F 6/00* (2013.01)

(58) Field of Classification Search
CPC .......... G01R 33/0354; G01R 33/00; G01R 33/0035; G01R 33/0023; G01R 33/0017; G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| | | | |
|---|---|---|---|
| 8,179,133 B1* | 5/2012 | Kornev | G01R 33/0354 324/225 |
| 2012/0088674 A1* | 4/2012 | Faley | G01R 33/0354 505/150 |
| 2019/0341540 A1* | 11/2019 | Megrant | H10N 60/01 |

* cited by examiner

*Primary Examiner* — Jermele M Hollington
*Assistant Examiner* — Taqi R Nasir
(74) *Attorney, Agent, or Firm* — Naval Information Warfare Center, Pacific; Kyle Eppele; Matthew D. Pangallo

(57) ABSTRACT

A superconducting electronic circuit includes at least two SQUID elements, an array of at least three Josephson Junctions, and a magnetic source element. Each SQUID element has no shared Josephson Junctions or at least one shared Josephson Junction with another SQUID element and at least one exclusive Josephson Junction. The array of at least three Josephson Junctions are connected in one, two, or three-dimensions. The magnetic source element has an electrically-tunable spatially non-uniform magnetic field.

19 Claims, 5 Drawing Sheets

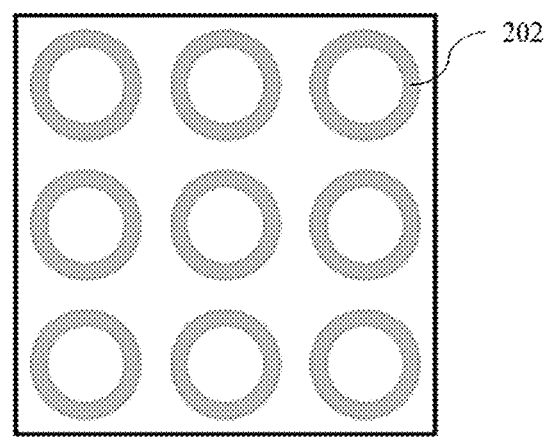
FIG. 3A
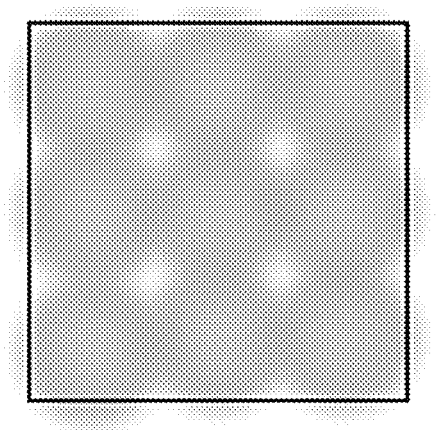 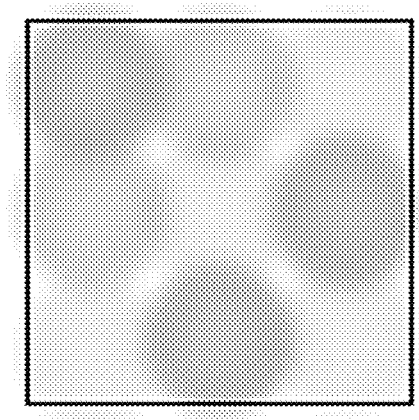 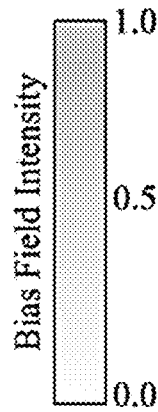
FIG. 3B	FIG. 3C

SUPERCONDUCTING ELECTRONIC CIRCUIT

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

BACKGROUND

Superconducting Quantum Interference Devices (SQUIDs) are one of the most sensitive type of magnetometers. SQUIDs utilize a small loop of superconducting material with two weak links called Josephson junctions (JJs) to sense the magnetic field. A SQUID array consists of a single circuit of many SQUID elements that are arranged in one, two, or three dimensions. When a SQUID array consists of a non-linear distribution of SQUID elements, the circuit exhibits a voltage-flux transfer function with a single minimum, called the anti-peak, under an applied local magnetic field. SQUIDs have many uses, such as in magnetic property measurement systems (e.g., SQUID magnetometry), magnetic anomaly detectors, magnetic resonance imaging, or scanning SQUID microscopy.

DESCRIPTION OF THE DRAWINGS

Features and advantages of examples of the present disclosure will be apparent by reference to the following detailed description and drawings, in which like reference numerals correspond to similar, but in some instances, not identical, components. Reference numerals or features having a previously described function may or may not be described in connection with other drawings in which they appear.

FIG. 3A-3C is a top view of an example of a top-view of a 3×3 planar electromagnetic coil circuit and the corresponding perpendicular magnetic field profiles that result from uniform and non-uniform power distributions;

DETAILED DESCRIPTION

A SQUID is a superconductor material loop containing at least one Josephson Junction, which allows for the measurement of magnetic flux quanta when a magnetic field threads the superconducting loop. A SQUID array is a single superconducting circuit comprised of many (e.g., 10 to 1 million) individual SQUID elements that are connected in one, two, or three-dimensional configurations. In general, the temperature-dependent direct current (DC) and alternating current (AC) response of a SQUID or SQUID array depends on the superconductor material used to fabricate the SQUID elements, the tunnel barrier material which comprises the Josephson Junction (commonly an insulator), and the geometry configuration of the superconducting circuit (e.g. trace volume, loop area, tunnel barrier volume, etc.). Currently, a new SQUID or SQUID array has to be fabricated to adjust or optimize the DC and RF performance metrics for each application the SQUID or SQUID array is being used for or each platform the SQUID or SQUID array is being used in. Therefore, the fabrication of a new SQUID or SQUID array for each new application or a change in an existing application can result in a significant investment of time and resources.

Figure 1:
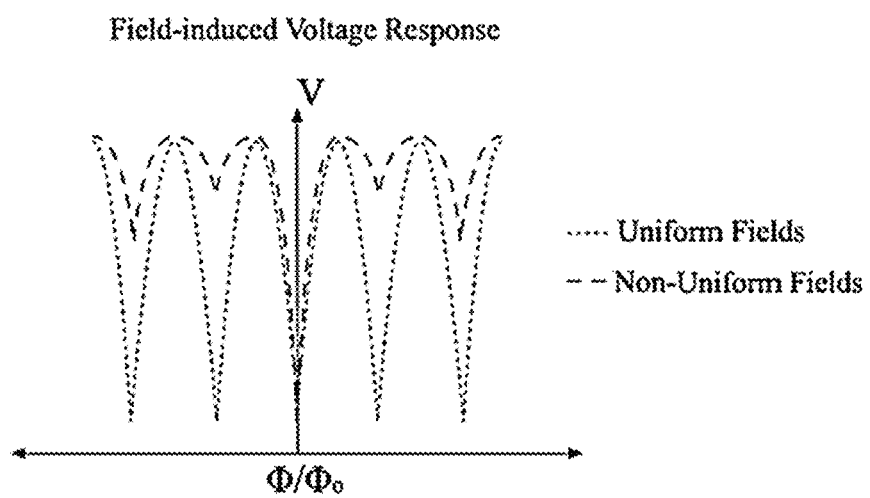
FIG. 1 is a plot of an example of field-induced voltage response via uniform and non-uniform magnetic fields showing the normalized magnetic flux dependent voltage response (X-axis, labeled "$\Phi/\Phi_o$") vs the voltage (Y-axis, labeled "V")

The superconducting electronic circuit herein can simultaneously improve or adjust performance of the SQUID or SQUID array while reducing the investment of time and resources needed to fabricate a new SQUID or SQUID array. The superconducting electronic circuit includes non-uniform magnetic field sources and an individual SQUID, SQUID array, or multiple SQUID array. The non-uniform magnetic field is used to adjust and optimize the DC and RF performance of individual SQUIDs, a SQUID array, or multiple SQUID arrays in the superconducting electronic circuit. When using uniform magnetic fields on a SQUID array with symmetric Josephson Junction distribution, the field induced voltage response is symmetric over an integer multiple of $\Phi_o$ under a fixed bias current $I_b$. In contrast, non-uniform magnetic fields on a SQUID array with symmetric Josephson Junction distribution can result in a voltage response with a single maxima peak that mimics the response of a SQUID array with asymmetric Josephson Junction distribution and symmetric wire geometry. This is shown in the plot in FIG. 1, which shows a single maxima peak for the non-uniform magnetic field vs. a symmetric response for uniform magnetic fields. As a result, the non-uniform magnetic fields can be fine-tuned to produce DC and RF performance improvements. The superconducting circuit improves performance or adjusts performance for a new application, without the need to fabricate a new SQUID or SQUID array, thereby reducing additional time and resources.

The superconducting electronic circuit herein includes at least two SQUID elements, an array of at least three Josephson Junctions, and a magnetic source element. Each SQUID element has no shared Josephson Junctions or at least one shared Josephson Junction with another SQUID element and at least one exclusive Josephson Junction. The array of at least three Josephson Junctions are connected in one, two, or three-dimensions. The magnetic source element has an electrically-tunable spatially non-uniform magnetic field.

The superconducting electronic circuit includes at least two SQUID elements. The SQUID elements include a superconducting loop path having two Josephson junctions, with one junction along each path segment. The SQUID element may be any shape, such as a square or circle with the Josephson Junctions being connected around each superconducting element. In some examples, a SQUID element has no shared Josephson Junctions, such as a one-dimensional array, some two-dimensional arrays, or three-dimensional arrays of Josephson Junctions. In other examples, each SQUID element has at least one shared Josephson Junction with another SQUID element and at least one exclusive Josephson Junction that is not shared with another SQUID element, such as one, two, or three-dimensional arrays.

The superconducting electronic circuit also includes a magnetic source element, where the magnetic source element has an electrically-tunable spatially non-uniform magnetic field. In an example, the magnetic source element includes magnetic sub-elements that provide a magnetic field. In some examples, the magnetic sub-elements can exist in the near-field and far-field depending on the magnetic sub-element configuration. In an example, the magnetic sub-elements may be anything that can be used for millimeter to microscale magnetic field biasing.

Some examples of a magnetic sub-element include multi-wound electromagnetic coils, magnetic hoses, magnetic thin films, bulk magnetic materials, and combinations thereof. The magnetic sub-elements may be composed of a superconducting material or a non-superconducting material. Some examples for magnetic sub-elements composed of superconducting material include any low or high temperature superconducting material, such as a metal or metal alloy. Some examples include Nb, Al, YBCO, NbTi, NbN, NbGe, NbAl, NbCN, NbSn, and combinations thereof. Some examples for magnetic sub-elements composed of non-superconducting material include gold, silver, palladium, platinum, copper, tungsten, beryllium copper, aluminum, or an alloy of gold, silver, palladium, platinum, copper, tungsten, aluminum, and combinations thereof. The non-superconducting material may also be a topological insulator material selected from the group consisting of $Bi_2Se_3$, $Bi_2Te_3$, $Bi_{(1-x)}Sb_{(x)}$, $Sb_2Te_3$, $Bi_{(1.1)}Sb_{(0.9)}Te_{(2)}S$. In some examples, the magnetic source element includes magnetic sub-elements for each Josephson Junction and the magnetic sub-element applies a magnetic field to each individual Josephson Junction. In other examples, the magnetic source element includes magnetic sub-elements for multiple Josephson Junctions and the magnetic sub-element applies a magnetic field to two or more Josephson Junctions.

In some examples, the magnetic source element may have magnetic sub-elements where each magnetic sub-element provides the same strength and direction of magnetic field, a different strength and direction of magnetic field, the same strength and different direction of magnetic field, a different strength and the same direction of magnetic field, or a combination thereof. When the magnetic sub-elements are composed of type I superconductors, the magnetic field ranges from greater than zero to less than the first critical field of the type I superconductor. Some examples of type I superconductors include Al, Pb, La, Ta, Sn, In, Pd, Cr, and combinations thereof. When the magnetic sub-elements are composed of type II superconductors, the magnetic field ranges from greater than zero to less than the second critical field of the type II superconductor. Some examples of type II superconductors include Nb, YBCO, NbTi, NbN, NbGe, NbAl, NbCN, NbSn, and combinations thereof.

Figure 2A:
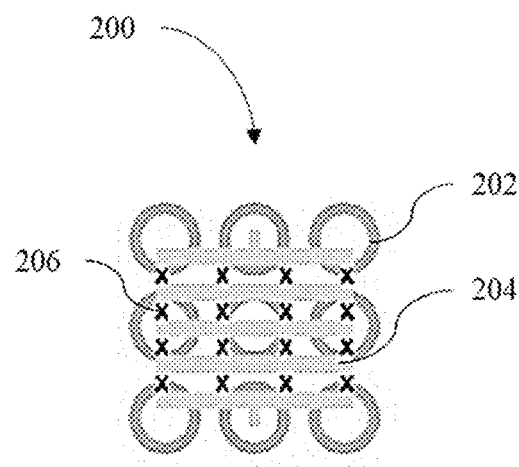
FIG. 2A-2B is a top view of an example of non-uniform bias field configuration using 3×3 planar electromagnetic coil circuit and the respective perpendicular magnetic field surface that results from uniform current distribution on each coil-element.
Figure 2B:
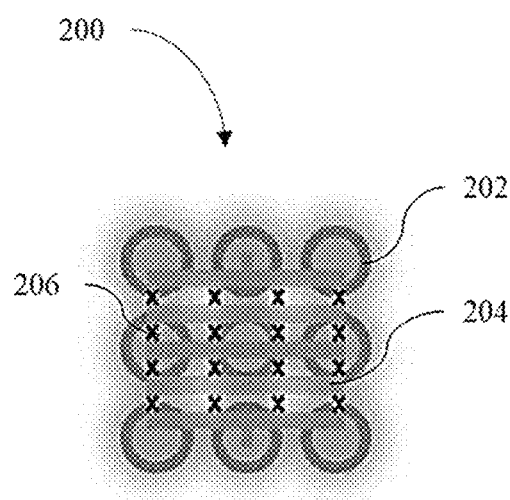

Referring now to FIG. 2A-2B, a top view of an example of a non-uniform bias field configuration 200 using 3×3 planar multi-wound electromagnetic coil circuit and the respective surface perpendicular magnetic field that results from uniform current distribution on each coil-element. In FIG. 2A, the two-dimensional 4×4 planar SQUID array with symmetric Josephson Junction distribution and symmetric width is shown along with the 3×3 planar electromagnetic coil circuit. FIG. 2A includes the Josephson Junctions 206, the superconducting material 204, and the electromagnetic coils 202. In FIG. 2B, a near uniform magnetic field is applied to the two-dimensional 4×4 planar SQUID array of Josephson Junctions 206 by a 3×3 geometry of the multi-wound electromagnetic coils 202. FIG. 2A-2B illustrate a configuration that allows the superconducting electronic circuit to apply a near uniform (e.g., FIG. 2B) magnetic field while FIG. 3C shows a non-uniform magnetic field.

Referring now to FIG. 3A-3C, a top view of an example a 3×3 planar electromagnetic coil circuit and the corresponding perpendicular magnetic field profiles that result from uniform and non-uniform power distributions is shown. In FIG. 3A, the 3×3 planar multi-wound electromagnetic coil circuit is shown. In FIG. 3B, a near uniform magnetic field is shown similar to FIG. 2B previously disclosed herein where each multi-wound electromagnetic coil applies the same strength and direction of magnetic field to the array of Josephson Junctions. In FIG. 3C, a non-uniform magnetic field is shown where each multi-wound electromagnetic coil applies a different strength and direction of magnetic field to the array of Josephson Junctions.

Figure 4A:
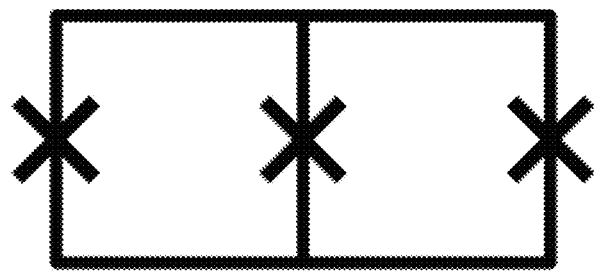
FIG. 4A-4C show examples of one, two, and three-dimensional arrays of three Josephson Junctions.
Figure 4B:
Figure 4C:
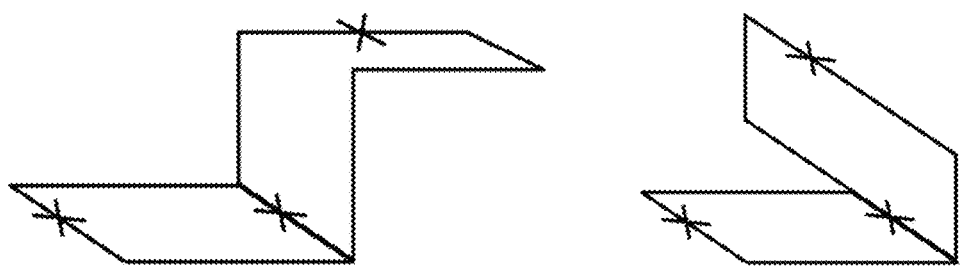

The superconducting electronic circuit also includes an array of at least three Josephson Junctions. The Josephson Junctions form an array of Josephson Junctions when connected together. Some examples of an array of Josephson Junctions are at least three Josephson Junctions connected in one, two, or three-dimensions. For example, a one-dimensional array includes three or more Josephson Junctions connected in-series or parallel. A two-dimensional array includes three or more Josephson Junctions connected in-series and parallel. A three-dimensional array could entail three or more Josephson Junctions connected in-series, parallel, and stacked together in the Z-direction with other Josephson Junctions connected in-series and parallel. Any type of one, two, or three-dimensional array may be used to connect the Josephson Junctions. Josephson Junction arrays that are one, two, or three-dimensional may have SQUID elements with no shared Josephson Junctions or at least one shared Josephson Junction and at least one exclusive Josephson Junction. FIG. 4A shows an example of a one-dimensional array of three Josephson Junctions. FIG. 4B shows two examples of two-dimensional arrays of three Josephson Junctions. FIG. 4C shows two examples of three-dimensional arrays of three Josephson Junctions.

Figure 5A:
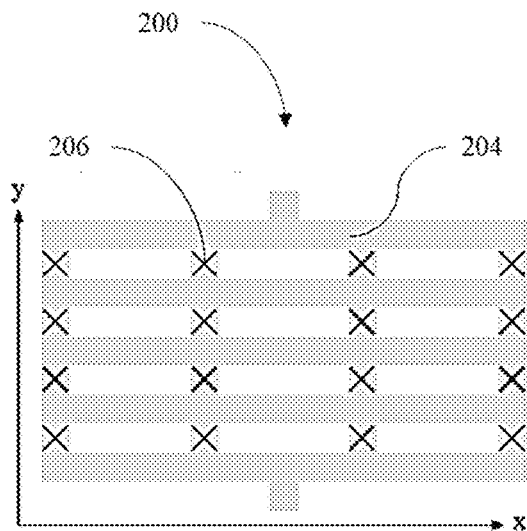
FIG. 5A-5D are examples of planar 4×4 SQUID arrays of Josephson Junctions with a symmetric distribution and a symmetric width, a symmetric distribution and an asymmetric width, an asymmetric distribution and a symmetric width, and an asymmetric distribution and an asymmetric width, respectively.
Figure 5B:
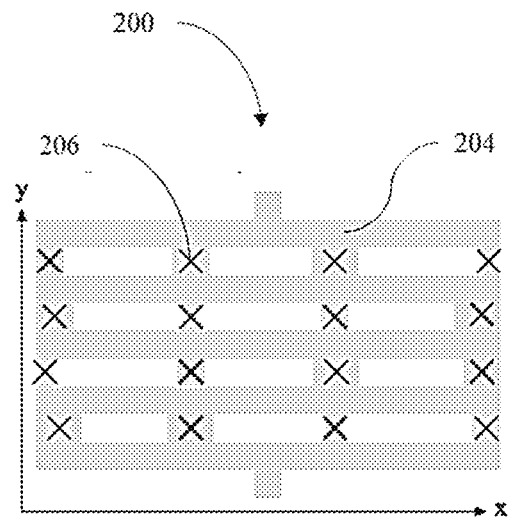
Figure 5C:
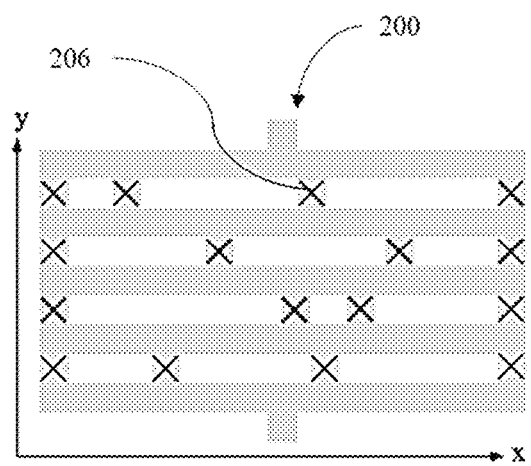
Figure 5D:
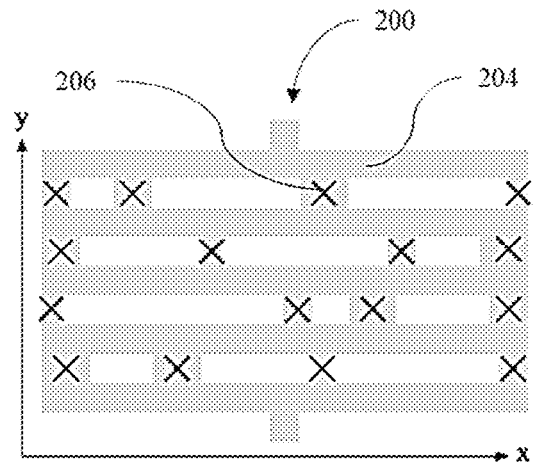

Referring now to FIG. 5A-5D, the array of Josephson Junctions 206 can have one of four different configurations. In one example, the array of Josephson Junctions 206 has a symmetric distribution and a symmetric width, as shown in FIG. 5A. In another example, the array of Josephson Junctions 206 has a symmetric distribution and an asymmetric width, as shown in FIG. 5B. In yet another example, the array of Josephson Junctions 206 has an asymmetric distribution and a symmetric width, as shown in FIG. 5C. In another example, the array of Josephson Junctions 206 has an asymmetric distribution and an asymmetric width, as shown in FIG. 5D.

In particular, the Josephson Junctions may have a width ranging from about 5 nm to about 100 microns. In an example, the width may vary within an array of Josephson Junctions, as previously disclosed herein when the width is asymmetrical. When the width varies within an array of Josephson Junctions, the width variation is equal to or less than 40% within the array. For example, if the largest Josephson Junction width is about 1 micron, the smallest Josephson Junction width is about 0.6 microns. In another example, the width is the same for every Josephson Junction within the array, as previously described herein when the width of the Josephson Junctions are symmetrical.

In addition to the different configurations, in some examples, the array of Josephson Junctions can have equal to or less than 100 Josephson Junctions and each individual Josephson Junction may include a magnetic sub-element capable of providing an independent magnetic field strength and direction. In another example, the array of Josephson Junctions is greater than 100 Josephson Junctions and the magnetic source element includes magnetic sub-elements for groups or sections of three or more Josephson Junctions capable of providing an independent magnetic field strength and direction for the groups or sections of Josephson Junctions. In an example, a two-dimensional array with 12 SQUIDs coupled in parallel by 85 coupled in series for 1020 total SQUIDs can have magnetic sub-elements for different sections of the array that can provide independent magnetic field strengths and directions depending on the positioning of the magnetic sub-elements within the superconducting electric circuit as previously disclosed herein.

The SQUID elements of the superconducting electronic circuit can be composed of any low temperature superconducting material, high temperature superconducting material, or combinations thereof. Some examples include Nb, Al, YBCO, NbTi, NbN, NbGe, NbAl, NbCN, NbSn, and combinations thereof. The Josephson Junctions may be a grain boundary between two high or low temperature superconducting materials, or a combination of the latter, and an insulator composed of an oxide, such as $AlO_x$ where x=the molecular ratio. In some examples, the same or different materials can be utilized for the SQUID elements, Josephson Junctions, and magnetic source element. For example, the SQUID elements may be made of a low temperature superconducting material, while the magnetic source element is made of a high temperature superconducting material. In another example, both the SQUID element and magnetic source element may be made of the same material.

Additional components may also be added to the superconducting electronic circuit. Some examples include a SQUID amplifier or a resistive shunt to dispel excess current. These components may be any known SQUID amplifier or resistive shunt.

To further illustrate the present disclosure, examples are given herein. These examples are provided for illustrative purposes and are not to be construed as limiting the scope of the present disclosure.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of a list should be construed as a de facto equivalent of any other member of the same list merely based on their presentation in a common group without indications to the contrary.

Unless otherwise stated, any feature described herein can be combined with any aspect or any other feature described herein.

Reference throughout the specification to "one example", "another example", "an example", means that a particular element (e.g., feature, structure, and/or characteristic) described in connection with the example is included in at least one example described herein, and may or may not be present in other examples. In addition, the described elements for any example may be combined in any suitable manner in the various examples unless the context clearly dictates otherwise.

The ranges provided herein include the stated range and any value or sub-range within the stated range. For example, a range from about 10 nm to about 10 microns should be interpreted to include not only the explicitly recited limits of from about 10 nm to about 10 microns, but also to include individual values, such as 50 nm, 1 micron, 13.5 microns, etc., and sub-ranges, such as from about 50 nm to about 5 microns, etc.

In describing and claiming the examples disclosed herein, the singular forms "a", "an", and "the" include plural referents unless the context clearly dictates otherwise.

What is claimed is:

1. A superconducting electronic circuit, comprising:
   at least two SQUID elements, wherein each SQUID element has one of:
   i) no shared Josephson Junctions; or
   ii) at least one shared Josephson Junction with another SQUID element and at least one exclusive Josephson Junction;
   an array of at least three Josephson Junctions, wherein the three Josephson Junctions are connected in one, two, or three dimensions; and
   a magnetic source element, wherein the magnetic source element has an electrically-tunable spatially non-uniform magnetic field.

2. The superconducting electronic circuit of claim 1, wherein SQUID element is selected from a material consisting of Nb, Al, YBCO, NbTi, NbN, NbGe, NbAl, NbCN, NbSn, and combinations thereof.

3. The superconducting electronic circuit of claim 1, wherein the magnetic source element includes magnetic sub-elements for each Josephson Junction in the array of Josephson Junctions.

4. The superconducting electronic circuit of claim 3, wherein the magnetic sub-elements are selected from the group consisting of multi-wound electromagnetic coils, magnetic hoses, magnetic thin films, bulk magnetic materials, and combinations thereof.

5. The superconducting electronic circuit of claim 1, wherein the array of Josephson Junctions has one of:
   i) a symmetric distribution and a symmetric width;
   ii) a symmetric distribution and an asymmetric width;
   iii) an asymmetric distribution and a symmetric width; or
   iv) an asymmetric distribution and a asymmetric width.

6. The superconducting electronic circuit of claim 3, wherein each magnetic sub-element is a type I superconductor and the magnetic field ranges from greater than zero to less than the first critical field of the type I superconductor or each magnetic sub-element is a type II superconductor and the magnetic field ranges from greater than zero to less than the second critical field of the type II superconductor.

7. The superconducting electronic circuit of claim 3, wherein each magnetic sub-element has a same strength and direction of magnetic field, a different strength and direction of magnetic field, the same strength and different direction of magnetic field, a different strength and the same direction of magnetic field, or a combination thereof.

8. The superconducting electronic circuit of claim 4, wherein the magnetic sub-elements are composed of a superconducting material or a non-superconducting material.

9. The superconducting electronic circuit of claim 3, wherein the array of Josephson Junctions has equal to or less than 100 Josephson Junctions and each magnetic sub-element provides an independent magnetic field strength and direction.

10. The superconducting electronic circuit of claim 1, wherein the array of Josephson Junctions has equal to or greater than 100 Josephson Junctions and the magnetic source element includes magnetic sub-elements for groups of three or more Josephson Junctions in the array of Josephson junctions that are capable of providing an independent magnetic field strength and direction.

11. The superconducting electronic circuit of claim 5, wherein the Josephson Junctions have a width ranging from about 5 nm to about 100 microns.

12. The superconducting electronic circuit of claim 11, wherein the Josephson Junctions have a width variation equal to or less than 40%.

13. The superconducting electronic circuit of claim 1, wherein the magnetic source element includes magnetic sub-elements that are a superconducting material selected from the group consisting of Nb, NbTi, NbN, NbGe, NbAl, NbCN, NbSn, Al, YBCO, and combinations thereof.

14. The superconducting electronic circuit of claim 1, wherein the magnetic source element includes magnetic sub-elements that are a non-superconducting material selected from the group consisting of gold, silver, palladium, platinum, copper, tungsten, aluminum, alloys of gold, silver, palladium, platinum, copper, tungsten, and aluminum, and combinations thereof.

15. The superconducting element of claim 1, wherein the array of Josephson Junctions is connected in one, two, or three-dimensions and the SQUID element has no shared Josephson Junctions.

16. The superconducting element of claim 1, wherein the array of Josephson Junctions is connected in one, two, or three-dimensions and the SQUID element has at least one shared Josephson Junction and at least one exclusive Josephson Junction.

17. The superconducting electronic circuit of claim 1, wherein the magnetic source element includes magnetic sub-elements that are a non-superconducting material selected from the group consisting of $Bi_2Se_3$, $Bi_2Te_3$, $Bi_{(1-x)}Sb_{(x)}$, $Sb_2Te_3$, $Bi_{(1.1)}Sb_{(0.9)}Te_{(2)}S$.

18. The superconducting electronic circuit of claim 6, wherein the type I superconductor is selected from the group consisting of Al, Pb, La, Ta, Sn, In, Pd, Cr, and combinations thereof.

19. The superconducting electronic circuit of claim 6, wherein the type II superconductor is selected from the group consisting of Nb, YBCO, NbTi, NbN, NbGe, NbAl, NbCN, NbSn, and combinations thereof.

* * * * *